United States Patent [19]
Yosinski

[11] Patent Number: 5,708,379
[45] Date of Patent: Jan. 13, 1998

[54] ELECTRONICALLY PROGRAMMABLE OUTPUT IMPEDANCE CIRCUIT

[75] Inventor: Neil J. Yosinski, Colorado Springs, Colo.

[73] Assignee: Hewlett-Packard Company, Palo Alto, Calif.

[21] Appl. No.: 790,233

[22] Filed: Jan. 28, 1997

Related U.S. Application Data

[63] Continuation of Ser. No. 505,121, Jul. 21, 1995, abandoned.

[51] Int. Cl.$^6$ ............................................. H03H 11/16
[52] U.S. Cl. ............................ 327/129; 327/260; 327/361; 363/74
[58] Field of Search .................................. 327/129, 181, 327/260, 361, 518; 363/74

[56] References Cited

U.S. PATENT DOCUMENTS

| | | | |
|---|---|---|---|
| 4,885,674 | 12/1989 | Varga et al. | 363/21 |
| 4,973,174 | 11/1990 | Losic et al. | 388/811 |
| 5,001,770 | 3/1991 | Losic et al. | 388/811 |
| 5,013,998 | 5/1991 | Varga et al. | 323/285 |
| 5,177,676 | 1/1993 | Inam et al. | 363/80 |

*Primary Examiner*—Timothy P. Callahan
*Assistant Examiner*—Jeffrey Zweizig
*Attorney, Agent, or Firm*—Jonathan B. Penn

[57] ABSTRACT

A method and apparatus for generating an AC voltage with user defined inductance and resistance values in series therewith is described. The output voltage of the AC source is sampled and a signal indicative of the total current being generated is derived. The signal is scaled to model a series resistance and scaled and differentiated to model a series inductance. The modelled series resistance and inductance are then combined with the output voltage. Different inductances and resistances can be modelled merely by changing the user's input to the microcontroller that controls the operation of the present invention.

1 Claim, 3 Drawing Sheets

SYSTEM IMPEDANCE IN OHMS AT 50 Hz

| COUNTRY | PERCENTAGE OF CONSUMERS WITH LESS THAN STATED IMPEDANCE | | | |
|---|---|---|---|---|
| | 98% | 95% | 90% | 85% |
| AUSTRALIA | — | 0.43 + j 0.33 | — | — |
| BELGIUM | — | 0.63 + j 0.33 | 0.32 + j 0.17 | 0.28 + j 0.15 |
| FRANCE | — | 0.55 + j 0.34 | 0.45 + j 0.25 | 0.34 + j 0.21 |
| GERMANY | — | 0.45 + j 0.25 | 0.36 + j 0.21 | 0.31 + j 0.17 |
| IRELAND* | 1.47 + j 0.64 | 1.26 + j 0.60 | 1.03 + j 0.55 | 0.94 + j 0.43 |
| ITALY | — | 0.59 + j 0.32 | 0.48 + j 0.26 | 0.44 + j 0.24 |
| NETHERLANDS | — | 0.70 + j 0.25 | 0.41 + j 0.21 | 0.32 + j 0.17 |
| SWITZERLAND | — | 0.60 + j 0.36 | 0.42 + j 0.25 | 0.30 + j 0.18 |
| UNITED KINGDOM | 0.46 + j 0.45 | — | 0.25 + j 0.23 | — |
| UNION OF SOVIET SOCIALIST REPUBLICS | — | 0.63 + j 0.30 | 0.50 + j 0.26 | — |

* SYSTEM IMPEDANCES FOR HOUSEHOLD CONSUMERS IN POLAND ARE SIMILAR TO THOSE IN IRELAND.

*Figure 2*

ELECTRONICALLY PROGRAMMABLE OUTPUT IMPEDANCE CIRCUIT

CROSS REFERENCE TO RELATED APPLICATION

This is a continuation of application Ser. No. 08/505,121 filed on Jul. 21, 1995, now abandoned.

BACKGROUND OF THE INVENTION

A product which will operate from an AC power line must be tested to verify the design and operation of the product's AC input circuitry. A typical AC input circuit is illustrated in FIG. 1. The AC input circuit 10 uses rectifiers 12 and filter circuit 14 to convert an AC input voltage from 50/60 Hz AC line 5 into a crude DC primary bus voltage. Rectifier 12 and filter 14 form a non-linear load that conducts large currents during portions of the AC sine wave and little current at other times. The shape of the current produced by input circuit 10 is not sinusoidal and is not easy to predict. Several aspects of input circuit 10's operation are dependent on the driving impedance of the AC power source. The RMS current, peak current, power factor, crest factor and rectified bus voltage are some of the parameters that can be affected by the interaction of the product's AC input circuitry and the AC power line's impedance.

50/60 Hz AC line 5 can be modelled as a series resistance 6 and an inductance 8. The values of these parameters vary across all AC power installations. FIG. 2 is a table showing how AC resistance and inductance varies worldwide. More importantly to designers of AC input circuitry, the impedance of these different AC power systems is not fully controlled and can vary widely. Therefore, the AC input circuit's designer must verify that the circuit can function correctly under a wide range of possible driving impedances.

It is typically not a simple matter to verify the design of the AC input circuitry under a variety of AC line impedances. A large assortment of power resistors and power inductors are needed to simulate various line impedances. These components are large, expensive, and must also be fully characterized before they can be used for testing purposes. The inductance and resistance of the AC source powering the system would also have to be characterized, so that these values could be factored into the tests. This task assumes that the AC source has a constant output impedance that can be properly measured and factored in, which is unfortunately simply not the case with many currently available AC sources.

Although the option exists not to test a product in this fashion, as the complexity and expense of the test are large, the resulting product may then fail to operate correctly in some AC power environments. This is particularly true with higher power products that pull large currents from the AC line source and thereby induce large voltage disturbances across the AC line's impedance. In these situations, the primary failing is a diminished primary bus voltage under large line impedances.

An all-electronic means of simulating an inductive and resistive characteristic within an AC source is desirable. If this capacity was also made programmable, products which use AC line sources could be more easily tested under a wide variety of real line conditions.

SUMMARY OF THE INVENTION

The first embodiment of the present invention comprises an AC source with a programmable output inductance and resistance. An AC source with a voltage feedback loop is coupled to a programmable output inductance and resistance circuit. Under the direction of a microcontroller, the programmable inductance and resistance circuit models a resistance and inductance in series with the AC source voltage.

The present invention will now be described in detail with reference to the figures listed and described below.

BRIEF DESCRIPTION OF THE ILLUSTRATIONS

FIG. 2 is a table showing typical inductance/resistance values in various AC power systems.

DETAILED DESCRIPTION OF THE PREFERRED EMBODIMENTS

Figure 1:
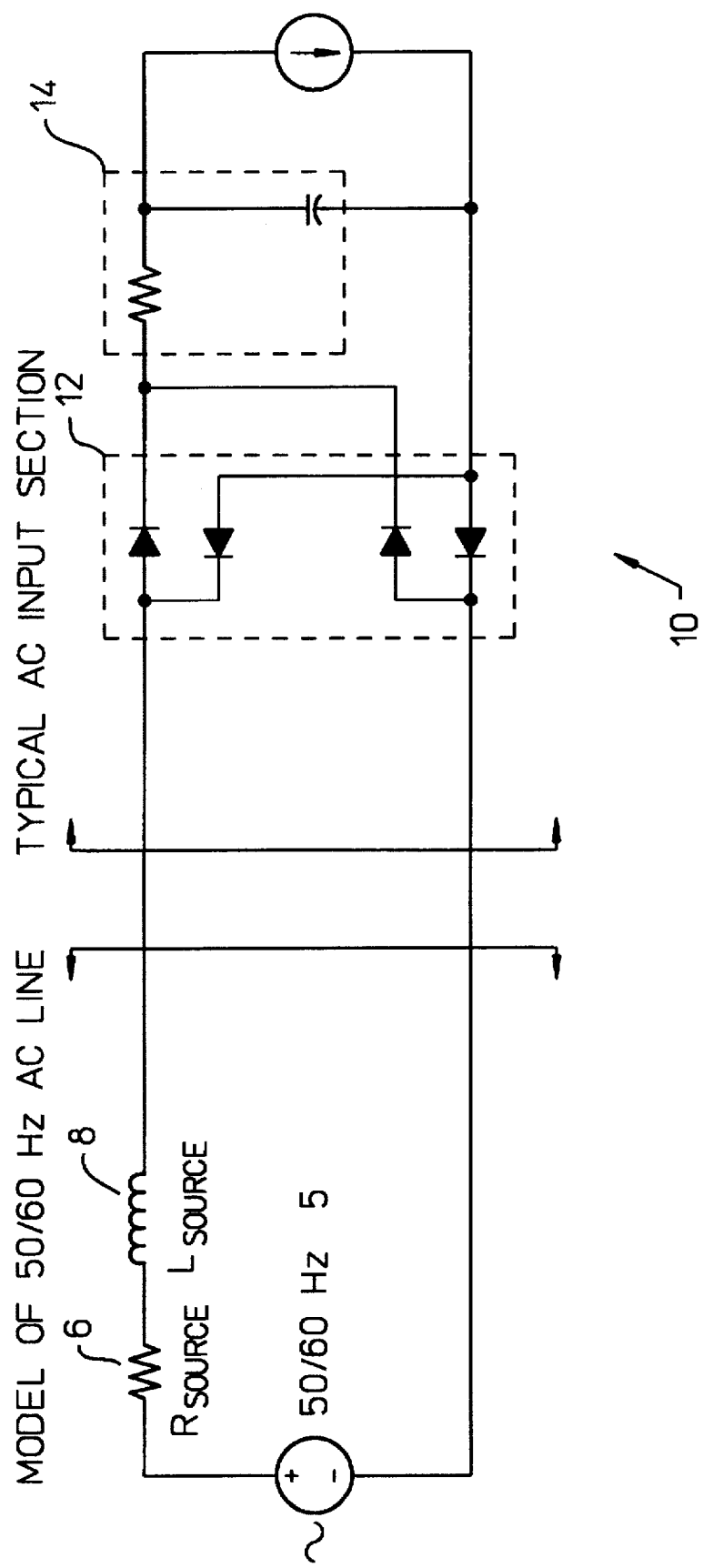
FIG. 1 is a schematic drawing which models a typical known AC power source and a typical AC input section.
Figure 3:
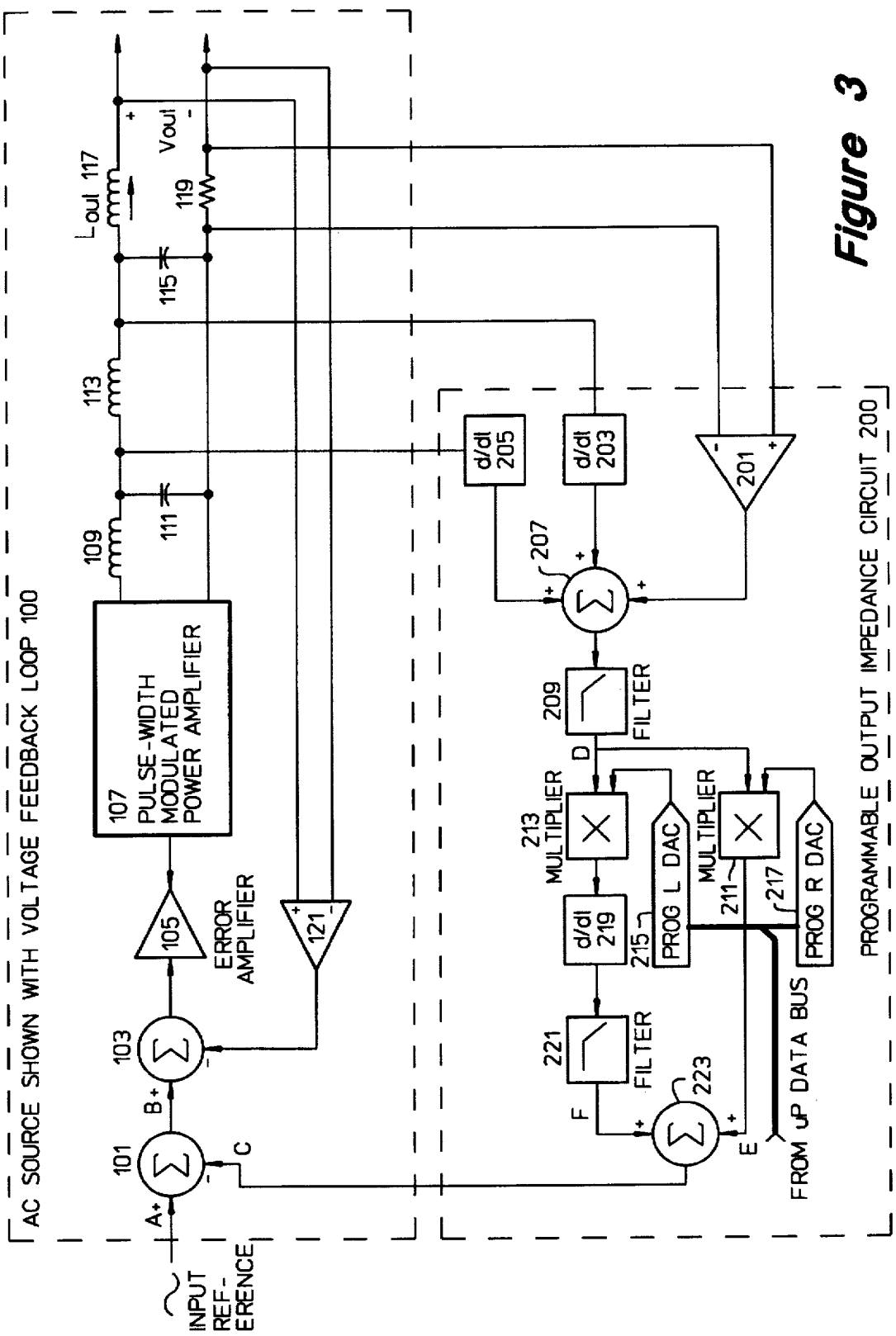
FIG. 3 is a block diagram of the first embodiment of the present invention.

A first embodiment of the present invention is shown in FIG. 3. The system comprises an AC source with a voltage feedback loop 100 and a programmable output impedance circuit 200. The AC source with a voltage feedback loop 100 produces an output voltage $V_{Out}$ at its output terminals having the same shape but possibly different in amplitude from the sine wave used as input to summer 101, which accepts as input the reference sine wave and the output of programmable output impedance circuit 200. The output from summer 101 is applied as input to summer 103, where it is summed with voltage feedback from the output of AC source 100. The feedback techniques used in AC source 100 are known. A series of inductor("L")/capacitor("C")/resistor ("R") filters formed from Ls 109, 113, and 117, Cs 111 and 115 and R 119 remove high frequency spurious signals from the $V_{Out}$ output.

Output impedance circuit 200 injects signal C into summer 101 such that the output voltage $V_{Out}$ is altered as a function of the output current $i_{out}$ and other internal filter voltages. The essential signal is $i_{out}$ and the ratio of $V_{Out}/i_{out}$ defines the output impedance of AC source 100.

Summer 207 is coupled to first differentiator 205, which is in turn coupled the common node of Ls 109 and 113 and C 111. Differentiator 205 provides a close estimate of the current flowing through C 111. The two inputs of differential amplifier 201 are coupled to the two terminals of R 119. Amplifier 201 thus generates a signal indicative of the amount of current the user is drawing from AC source 100. Differentiator 203 provides another signal indicative of the current flowing through the capacitors and to the user. When summed by summer 207, the output of summer 207 provides a signal indicative of the total current generated by pulse width modulated power amplifier 107. Knowledge of the current being drawn is needed to avoid resonance with the user's load.

Filter 209 is a lower bandpass filter and rejects frequencies above a predetermined threshold, as certain higher frequency signals can cause the present invention to become unstable. In this embodiment, the upper limit of the filter is approximately 2.5 KHz.

Feedback signal D is split into two channels that can be independently multiplied with the output of two programmable Digital to Analog converters ("DAC"s) 215 and 217. DACs 215 and 217 and multipliers 211 and 213 set the gain of the two channels of feedback. One channel is used to control inductance and the other channel is used to control resistance.

In the programmable resistance path E, the feedback signal D is sent through unaffected except for the gain established by DAC 217 and multiplier 211. This has the effect of perturbing the output voltage $V_{Out}$ proportionally to the output current $i_{out}$, which in effect appears as though there were a resistance in series with the output.

In the programmable inductance channel F, the feedback signal is differentiated by differentiator 219 and filtered by filter 221 before being combined with the output from the resistance channel, signal E, at summer 223. This differentiation produces voltage perturbations proportional to the derivative of the output current and therefore mimics an inductance in series with AC source 100's output. Filter 221 at the output of differentiator 219 removes high frequency effects.

DAC 215 and 217s' settings are provided by a central microprocessor(not shown), which sets the levels of feedback for each channel, allowing the user to set the amount of series resistance and inductance. Due to the frequency response characteristics of the programmable resistance loop (DAC 217 and multiplier 211), it contributes an inductance shift that, if unaccounted for, would limit the accuracy of the overall programmed inductance. However, the effect is predictable and can be accounted for by the microprocessor in the settings it sends to the DACs. The net effect is an accurately controlled resistance and inductance value.

The present invention offers complete control of both the series resistance and inductance. This permits evaluation of AC line operated products without the expenses of physical inductors and resistances. It is programmable and can be calibrated using the microprocessor control. Any secondary effects of the setting of one channel on the settings of the other channel can be compensated for by the microprocessor.

The value of the inductance is not affected by the magnitude of the current drawn from the source as would occur if a physical inductor utilizing a magnetic core material were used. The topology illustrated in FIG. 3 uses bipolar DACs that can be set negative so that the intrinsic output inductance of the AC source can be reduced to provide lower output impedance than the AC source would otherwise provide.

The present invention can be used in conjunction with a power supply supplying AC power of any frequency. It is not limited to 50/60 Hz AC power supplies.

What is claimed is:

1. An alternating current source for producing an alternating current output voltage, the source having a programmable output resistance characteristic and inductance characteristic, the source comprising:

an alternating current source with a first voltage feedback loop, the alternating current source with a first voltage feedback loop comprising:
  an input sinusoidal reference signal source;
  a first summer coupled to the reference signal source and a programmable output inductance characteristic and resistance characteristic circuit;
  a second summer coupled to the first summer;
an error amplifier coupled to the second summer;
  a pulse width modulated power amplifier coupled to the error amplifier;
  a plurality of filters coupled to the pulse width modulated power amplifier, the output voltage across a last filter comprising the alternating current output voltage; and
  a first differential amplifier with a positive and negative input coupled across the output voltage and a first output coupled to the second summer; and the programmable output inductance characteristic and resistance characteristic circuit coupled to the alternating current source with a first voltage feedback loop for providing a user-selected first inductance characteristic and first resistance characteristic independently of one another in series with the output voltage generated by the alternating current source, the programmable output inductance characteristic and resistance characteristic circuit further comprising:
  a first differentiator coupled to the output of a first filter;
  a second differentiator coupled to the output of a second filter;
  a second differential amplifier with a positive and negative input and a second output, the positive and negative inputs being coupled respectively to a first and second terminal of a sensing resistor, the sensing resistor coupled in series to the negative terminal of the alternating current output voltage;
  a third summer coupled to the first and second differentiator and to the second output of the second differential amplifier;
  a first bandpass filter coupled to the output of the third summer;
  a first and a second multiplier, the multipliers each being coupled to the first bandpass filter;
  a first and second digital to analog converter, each having an input and an output, the input of the first digital to analog converter being coupled to a microcontroller, the output of the first digital to analog converter being coupled to the first multiplier, the input of the second digital to analog converter being coupled to the microcontroller, the output of the second digital to analog converter being coupled to the second multiplier;
  a third differentiator coupled to an output from the first multiplier;
  a second bandpass filter coupled to an output of the third differentiator; and
  a fourth summer coupled to an output of the second bandpass filter and to an output of the second multiplier, an output of the fourth summer being coupled to the first summer.

* * * * *